(12) United States Patent
Hayashi et al.

(10) Patent No.: US 9,593,277 B2
(45) Date of Patent: Mar. 14, 2017

(54) CURABLE SILICONE COMPOSITION, CURED PRODUCT THEREFROM, AND OPTICAL SEMICONDUCTOR DEVICE

(71) Applicant: Dow Corning Toray Co., Ltd., Tokyo (JP)

(72) Inventors: Akito Hayashi, Ichihara (JP); Kazuhiro Nishijima, Ichihara (JP); Tomohiro Iimura, Ichihara (JP); Michitaka Suto, Ichihara (JP); Takashi Sagawa, Ichihara (JP); Akihiko Kobayashi, Ichihara (JP)

(73) Assignee: DOW CORNING TORAY CO., LTD., Chiyoda-Ku, Tokyo (JP)

( * ) Notice: Subject to any disclaimer, the term of this patent is extended or adjusted under 35 U.S.C. 154(b) by 0 days.

(21) Appl. No.: 15/114,457

(22) PCT Filed: Jan. 30, 2015

(86) PCT No.: PCT/JP2015/053316
§ 371 (c)(1),
(2) Date: Jul. 27, 2016

(87) PCT Pub. No.: WO2015/119227
PCT Pub. Date: Aug. 13, 2015

(65) Prior Publication Data
US 2016/0340580 A1 Nov. 24, 2016

(30) Foreign Application Priority Data
Feb. 4, 2014 (JP) .................................. 2014-019703

(51) Int. Cl.
*C08G 77/44* (2006.01)
*C09K 11/77* (2006.01)
(Continued)

(52) U.S. Cl.
CPC .......... *C09K 11/7706* (2013.01); *C08G 77/44* (2013.01); *C09K 11/025* (2013.01);
(Continued)

(58) Field of Classification Search
None
See application file for complete search history.

(56) References Cited

U.S. PATENT DOCUMENTS 7,192,795 B2 * 3/2007 Boardman .............. H01L 33/52
257/E23.119
7,282,270 B2 10/2007 Morita et al.
(Continued)

FOREIGN PATENT DOCUMENTS

| AT | 451426 T | 12/2009 |
|---|---|---|
| AT | 454430 T | 1/2010 |

(Continued)

OTHER PUBLICATIONS

International Search Report for Application No. PCT/JP2015/053315 dated Mar. 3, 2015, 5 pages.
(Continued)

*Primary Examiner* — Robert S Loewe
(74) *Attorney, Agent, or Firm* — Howard & Howard Attorneys PLLC

(57) ABSTRACT

A curable silicone composition comprising: (A) an organopolysiloxane represented by the average unit formula: $(R^1_3SiO_{1/2})_a(R^2_2SiO_{2/2})_b(R^3SiO_{3/2})_c$ ($R^1$ are alkyl groups, alkenyl groups, aryl groups, or aralkyl groups; $R^2$ are alkyl groups or alkenyl groups; $R^3$ is an alkyl group, aryl group, or an aralkyl group, provided that, in a molecule, at least 0.5 mol % of $R^1$ to $R^3$ are the alkenyl groups, at least one of $R^3$ is the aryl group or the aralkyl group; and a, b, and c are numbers satisfying: $0.01 \leq a \leq 0.5$, $0.4 \leq b \leq 0.8$, $0.01 \leq c \leq 0.5$, and $a+b+c=1$); (B) an organopolysiloxane that is different from
(Continued)

component (A); (C) an organopolysiloxane having at least two silicon atom-bonded hydrogen atoms in a molecule; and (D) a hydrosilylation reaction catalyst. A cured product exhibiting excellent dispersibility of phosphor and having high strength and gas barrier properties is formed.

10 Claims, 1 Drawing Sheet

(51) Int. Cl.
  *H01L 33/56* (2010.01)
  *H01L 33/50* (2010.01)
  *C09K 11/02* (2006.01)

(52) U.S. Cl.
  CPC ............ *H01L 33/502* (2013.01); *H01L 33/56* (2013.01); *C08G 2190/00* (2013.01)

(56) References Cited

U.S. PATENT DOCUMENTS

| | | | |
|---|---|---|---|
| 7,527,871 B2 | 5/2009 | Morita et al. | |
| 8,044,153 B2 | 10/2011 | Yamamoto et al. | |
| 8,080,614 B2 | 12/2011 | Morita et al. | |
| 8,217,388 B2 | 7/2012 | Kato et al. | |
| 8,614,282 B2* | 12/2013 | Hamamoto | C08L 83/04 428/447 |
| 8,937,136 B2* | 1/2015 | Choi | H01L 33/56 257/791 |
| 2006/0073347 A1 | 4/2006 | Morita et al. | |
| 2007/0112147 A1 | 5/2007 | Morita et al. | |
| 2009/0118441 A1 | 5/2009 | Yamamoto et al. | |
| 2009/0179180 A1 | 7/2009 | Morita et al. | |
| 2010/0276721 A1* | 11/2010 | Yoshitake | C08K 5/5425 257/99 |
| 2010/0301377 A1 | 12/2010 | Kato et al. | |
| 2011/0160410 A1* | 6/2011 | Sagawa | C08L 83/06 525/478 |
| 2013/0296514 A1* | 11/2013 | Choi | C08L 83/04 526/279 |
| 2014/0031509 A1* | 1/2014 | Ko | C08L 83/14 528/31 |
| 2014/0210338 A1* | 7/2014 | Matsumura | H01L 33/502 313/498 |
| 2015/0252221 A1* | 9/2015 | Iimura | C09D 183/04 524/588 |

FOREIGN PATENT DOCUMENTS

| | | |
|---|---|---|
| AT | 463537 T | 4/2010 |
| AT | 498659 T | 3/2011 |
| AU | 2003-260953 A1 | 5/2004 |
| CN | 1694925 A | 11/2005 |
| CN | 1863875 A | 11/2006 |
| CN | 101300305 A | 11/2008 |
| CN | 101506309 A | 8/2009 |
| CN | 101466795 B | 8/2011 |
| DE | 60 2007 003 724 | 1/2010 |
| DE | 60 2007 004 235 | 2/2010 |
| DE | 60 2004 026 456 | 5/2010 |
| DE | 60 2006 020 159 | 3/2011 |
| EP | 2 032 653 B1 | 12/2009 |
| EP | 2 061 840 B1 | 1/2010 |
| EP | 1 670 863 B1 | 4/2010 |
| EP | 1 945 716 B1 | 2/2011 |
| EP | 1 556 443 B1 | 3/2013 |
| JP | 2004-143361 A | 5/2004 |
| JP | 2005-105217 A | 4/2005 |
| JP | 2007-131694 A | 5/2007 |
| JP | 2008-001828 A | 1/2008 |
| JP | 2008-050494 A | 3/2008 |
| KR | 2005-0072123 A | 7/2005 |
| KR | 2006-0096429 A | 9/2006 |
| KR | 2008-0070816 A | 7/2008 |
| KR | 2009-0028720 A | 3/2009 |
| KR | 2009-0054429 A | 5/2009 |
| KR | 10-0976075 A | 8/2010 |
| KR | 2014-0064931 A | 5/2014 |
| MY | 134509 A | 12/2007 |
| MY | 142540 A | 12/2010 |
| MY | 145422 A | 2/2012 |
| MY | 147862 A | 1/2013 |
| TW | 2008-08908 A | 2/2008 |
| TW | 2008-11244 A | 3/2008 |
| WO | WO 2004/037927 A1 | 5/2004 |
| WO | WO 2005/003207 A1 | 4/2005 |
| WO | WO 2007/055395 A1 | 5/2007 |
| WO | WO 2007/148812 A1 | 12/2007 |
| WO | WO 2008/023537 A1 | 2/2008 |
| WO | WO 2015/119226 A1 | 8/2015 |

OTHER PUBLICATIONS

International Search Report for Application No. PCT/JP2015/053316 dated Mar. 3, 2015, 5 pages.
English language abstract not found for AT 451426; however, see English language equivalent U.S. Pat. No. 8,080,614.
English language abstract not found for AT 454430; however, see English language equivalent U.S. Pat. No. 8,217,388.
English language abstract not found for AT 463537; however, see English language equivalent U.S. Pat. No. 7,527,871.
English language abstract not found for AT 498659; however, see English language equivalent U.S. Pat. No. 8,044,153.
English language abstract not found for AU 2003-260953; however, see English language equivalent U.S. Pat. No. 7,282,270.
English language abstract not found for CN 1694925; however, see English language equivalent U.S. Pat. No. 7,282,270. Original document extracted from espacenet.com on Aug. 25, 2016, 21 pages.
English language abstract for CN 1863875 extracted from espacenet.com database on Aug. 25, 2016, 2 pages.
English language abstract for CN 101300305 extracted from espacenet.corn database on Aug. 25, 2016, 1 page.
English language abstract for CN 101506309 extracted from espacenet.corn database on Aug. 25, 2016, 1 page.
English language abstract for CN 101466795 extracted from espacenet.corn database on Aug. 25, 2016, 1 page.
English language abstract not found for DE 60 2007 003 724; however, see English language equivalent U.S. Pat. No. 8,080,614.
English language abstract not found for DE 60 2007 004 235; however, see English language equivalent U.S. Pat. No. 8,217,388.
English language abstract not found for DE 60 2004 026 456; however, see English language equivalent U.S. Pat. No. 7,527,871.
English language abstract not found for DE 60 2006 020 159; however, see English language equivalent U.S. Pat. No. 8,044,153.
English language abstract for JP 2004-143361 extracted from espacenet.com database on Aug. 25, 2016, 2 pages.
English language abstract for JP 2005-105217 extracted from espacenet.com database on Aug. 25, 2016, 2 pages.
English language abstract for JP 2007-131694 extracted from espacenet.com database on Aug. 25, 2016, 1 page.
English language abstract for JP 2008-001828 extracted from espacenet.com database on Aug. 25, 2016, 2 pages.
English language abstract for JP 2008-050494 extracted from espacenet.com database on Aug. 25, 2016, 2 pages.
English language abstract for KR 2005-0072123 extracted from espacenet.com database on Aug. 25, 2016, 2 pages.
English language abstract for KR 2006-0096429 extracted from espacenet.com database on Aug. 25, 2016, 2 pages.
English language abstract for KR 2008-0070816 extracted from espacenet.corn database on Aug. 25, 2016, 1 page.
English language abstract for KR 2009-0028720 extracted from espacenet.com database on Aug. 25, 2016, 2 pages.
English language abstract for KR 2009-0054429 extracted from espacenet.corn database on Aug. 25, 2016, 1 page.

(56) References Cited

OTHER PUBLICATIONS

English language abstract for KR 10-0976075 extracted from espacenet.com database on Aug. 25, 2016, 1 page.
English language abstract not found for KR 2014-0064931; however, see English language equivalent U.S. Pat. No. 7,527,871 Original document extracted from espacenet.com database on Aug. 25, 2016, 17 pages.
English language abstract for MY 134509 extracted from espacenet.com database on Aug. 25, 2016, 2 pages.
English language abstract for MY 142540 extracted from espacenet.com database on Aug. 25, 2016, 2 pages.
English language abstract for MY 145422 extracted from espacenet.com database on Aug. 25, 2016, 1 page.
English language abstract for MY 147862 extracted from espacenet.com database on Aug. 25, 2016, 2 pages.
English language abstract for TW 2008-08908 extracted from espacenet.com database on Aug. 25, 2016, 1 page.
English language abstract for TW 2008-11244 extracted from espacenet.com database on Aug. 25, 2016, 1 page.
English language abstract and machine-assisted English translation for WO 2015/119226 extracted from espacenet.com database on Aug. 25, 2016, 25 pages.

* cited by examiner

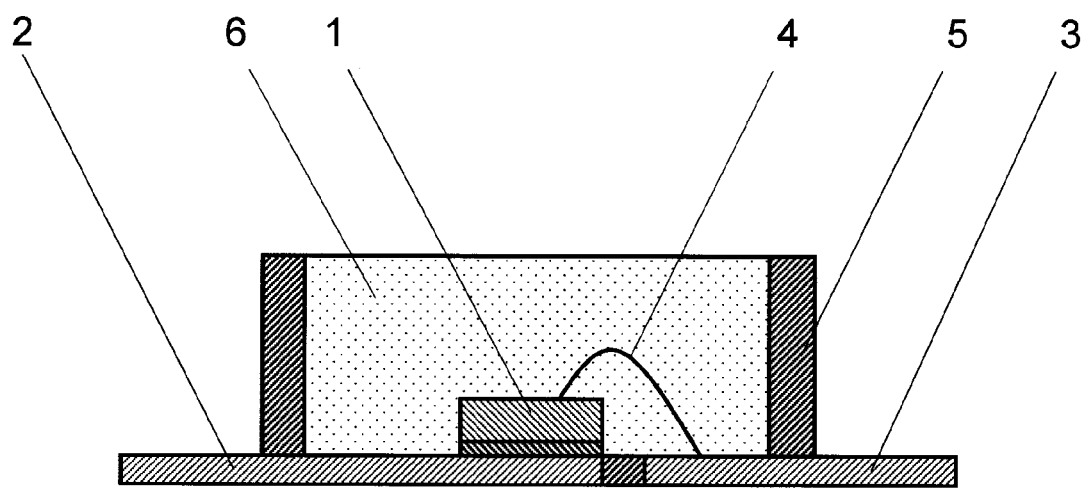

CURABLE SILICONE COMPOSITION, CURED PRODUCT THEREFROM, AND OPTICAL SEMICONDUCTOR DEVICE

CROSS-REFERENCE TO RELATED APPLICATIONS

This application is the National Stage of International Patent Application No. PCT/JP2015/053316, filed on Jan. 30, 2015, which claims priority to and all the advantages of Japanese Patent Application No. 2014-019703, filed on Feb. 4, 2014, the content of which is incorporated herein by reference.

TECHNICAL FIELD

The present invention relates to a curable silicone composition, a cured product thereof, and an optical semiconductor device produced using the composition.

BACKGROUND ART

Curable silicone compositions are used as sealing agents, protective agents, coating agents, or the like for optical semiconductor elements in optical semiconductor devices such as light emitting diodes (LEDs). Examples of such curable silicone compositions include curable silicone compositions comprising: a straight-chain organopolysiloxane having at least two alkenyl groups and at least one aryl group in a molecule; a branched-chain organopolysiloxane having an alkenyl group and an aryl group; an organopolysiloxane having at least two silicon atom-bonded hydrogen atom in a molecule; and a hydrosilylation reaction catalyst (see Patent Documents 1 to 3).

In general, such a curable silicone composition is used by blending a phosphor to convert the emission wavelength from the LED; however, because of poor dispersibility of the phosphor, the phosphor aggregates, thereby causing a problem in that the light from the LED becomes uneven.

Meanwhile examples of curable silicone compositions that form cured products having suitable hardness and strength include a curable silicone composition comprising: a straight-chain organopolysiloxane having at least two alkenyl groups in a molecule; at least two types of branched-chain organopolysiloxanes having a mass average molecular weight that is different from one another and comprising $SiO_{4/2}$ units, $R_2R'SiO_{1/2}$ units, and $R_3SiO_{1/2}$ units (in the formula, R represents a monovalent hydrocarbon group having no aliphatic unsaturated bond, and R' represents an alkenyl group); an organopolysiloxane having at least two silicon atom-bonded hydrogen atoms in a molecule; and a hydrosilylation reaction catalyst (see Patent Document 4).

However, the cured product of this composition has high gas permeability, and when this composition is used as a sealing agent for an optical semiconductor element, electrodes and phosphor thereof are corroded due to its low barrier properties to sulfur and water. As a result, there is a problem in that the light extraction efficiency from LED is reduced.

PRIOR ART DOCUMENTS

Patent Documents

Patent Document 1: Japanese Unexamined Patent Application Publication No. 2004-143361A Patent Document 2: Japanese Unexamined Patent Application Publication No. 2005-105217A Patent Document 3: Japanese Unexamined Patent Application Publication No. 2008-001828A Patent Document 4: Japanese Unexamined Patent Application Publication No. 2007-131694A

SUMMARY OF INVENTION

Technical Problem

An object of the present invention is to provide a curable silicone composition that has excellent dispersibility of phosphor and that forms a cured product having high strength and gas barrier properties when the curable silicone composition is cured. Another object of the present invention is to provide a cured product having excellent dispersibility of phosphor, and high strength and gas barrier properties. Yet another object of the present invention is to provide an optical semiconductor device with excellent reliability.

Solution to Problem

The curable silicone composition of the present invention is characterized by comprising:

(A) an organopolysiloxane represented by the average unit formula:

$$(R^1{}_3SiO_{1/2})_a(R^2{}_2SiO_{2/2})_b(R^3SiO_{3/2})_c$$

in the formula, $R^1$ are the same or different, and alkyl groups having from 1 to 12 carbons, alkenyl groups having from 2 to 12 carbons, aryl groups having from 6 to 20 carbons, or aralkyl groups having from 7 to 20 carbons; $R^2$ are the same or different, and alkyl groups having from 1 to 12 carbons or alkenyl groups having from 2 to 12 carbons; $R^3$ is an alkyl group having from 1 to 12 carbons, aryl group having from 6 to 20 carbons, or an aralkyl group having from 7 to 20 carbons, provided that, in a molecule, at least 0.5 mol % of a total content of the groups represented by $R^1$, $R^2$, and $R^3$ are the alkenyl groups, at least one of the group represented by $R^3$ is the aryl group or the aralkyl group; and a, b and c are numbers satisfying: $0.01 \leq a \leq 0.5$, $0.4 \leq b \leq 0.8$, $0.01 \leq c \leq 0.5$, and $a+b+c=1$;

(B) from 20 to 1,000 parts by mass, relative to 100 parts by mass of component (A), of an organopolysiloxane represented by the average unit formula:

$$(R^4{}_3SiO_{1/2})_d(R^4{}_2SiO_{2/2})_e(R^4SiO_{3/2})_f(SiO_{4/2})_g$$

in the formula, $R^4$ are, the same or different, and alkyl groups having from 1 to 12 carbons, alkenyl groups having from 2 to 12 carbons, aryl groups having from 6 to 20 carbons, or aralkyl groups having from 7 to 20 carbons, provided that, in a molecule, at least 0.5 mol % of a total content of the groups represented by $R^4$ are the alkenyl groups; and d, e, f, and g are numbers satisfying: $0.01 \leq d \leq 0.5$, $0 \leq e \leq 0.9$, $0 \leq f \leq 0.9$, $0 \leq g \leq 0.9$, and $d+e+f+g=1$; however, if f is a number satisfying: $0 \leq f \leq 0.5$, g is a number satisfying: $0 < g \leq 0.9$;

(C) an organopolysiloxane having at least two silicon atom-bonded hydrogen atoms in a molecule, in an amount such that a content of the silicon atom-bonded hydrogen atoms contained in this component is from 0.1 to 10 mol relative to 1 mol of the total content of the alkenyl groups contained in components (A) and (B); and (D) a hydrosilylation reaction catalyst, in an amount that accelerates curing of the composition.

The cured product of the present invention is characterized by curing the composition described above.

The optical semiconductor device of the present invention is characterized by having an optical semiconductor element sealed or coated with a cured product of the composition described above.

Advantageous Effects of Invention

The curable silicone composition of the present invention forms a cured product exhibiting excellent dispersibility of phosphor and having high strength and gas barrier properties. Furthermore, the cured product of the present invention exhibits excellent dispersibility of phosphor and has high strength and gas barrier properties. Furthermore, the optical semiconductor device of the present invention has excellent reliability.

BRIEF DESCRIPTION OF THE DRAWING

FIG. 1 is a cross-sectional view of a surface mounted type LED that is an example of an optical semiconductor device of the present invention.

DESCRIPTION OF EMBODIMENTS

First, the curable silicone composition of the present invention will be described in detail.

Component (A) is an organopolysiloxane represented by the average unit formula:

$$(R^1{}_3SiO_{1/2})_a(R^2{}_2SiO_{2/2})_b(R^3SiO_{3/2})_c.$$

In the formula, $R^1$ are the same or different, and alkyl groups having from 1 to 12 carbons, alkenyl groups having from 2 to 12 carbons, aryl groups having from 6 to 20 carbons, or aralkyl groups having from 7 to 20 carbons. Specific examples thereof include alkyl groups, such as a methyl group, ethyl group, propyl group, butyl group, pentyl group, hexyl group, heptyl group, octyl group, nonyl group, decyl group, undecyl group, and a dodecyl group; alkenyl groups, such as a vinyl group, allyl group, butenyl group, pentenyl group, hexenyl group, heptenyl group, octenyl group, nonenyl group, decenyl group, undecenyl group, and a dodecenyl group; aryl groups, such as a phenyl group, tolyl group, xylyl group, naphthyl group, anthracenyl group, phenanthryl group, and a pyrenyl group; aralkyl groups, such as a benzyl group, phenethyl group, naphthylethyl group, naphthylpropyl group, anthracenylethyl group, phenanthrylethyl group, and a pyrenylethyl group; and groups in which some or all of the hydrogen atoms bonded in these groups are substituted with halogen atoms, such as a chlorine atom and bromine atom.

Furthermore, in the formula, $R^2$ are the same or different, and alkyl groups having from 1 to 12 carbons or alkenyl groups having from 2 to 12 carbons. Specific examples thereof include alkyl groups, such as a methyl group, ethyl group, propyl group, butyl group, pentyl group, hexyl group, heptyl group, octyl group, nonyl group, decyl group, undecyl group, and a dodecyl group; alkenyl groups, such as a vinyl group, allyl group, butenyl group, pentenyl group, hexenyl group, heptenyl group, octenyl group, nonenyl group, decenyl group, undecenyl group, and a dodecenyl group; and groups in which some or all of the hydrogen atoms bonded in these groups are substituted with halogen atoms, such as a chlorine atom and bromine atom. All of $R^2$ are preferably the alkyl groups.

Furthermore, in the formula, $R^3$ is an alkyl group having from 1 to 12 carbons, aryl group having from 6 to 20 carbons, or an aralkyl group having from 7 to 20 carbons. Specific examples thereof include alkyl groups, such as a methyl group, ethyl group, propyl group, butyl group, pentyl group, hexyl group, heptyl group, octyl group, nonyl group, decyl group, undecyl group, and a dodecyl group; aryl groups, such as a phenyl group, tolyl group, xylyl group, naphthyl group, anthracenyl group, phenanthryl group, and a pyrenyl group; aralkyl groups, such as a benzyl group, phenethyl group, naphthylethyl group, naphthylpropyl group, anthracenylethyl group, phenanthrylethyl group, and a pyrenylethyl group; and groups in which some or all of the hydrogen atoms bonded in these groups are substituted with halogen atoms, such as a chlorine atom and a bromine atom.

In a molecule, at least 0.5 mol % of the total content of the groups represented by $R^1$, $R^2$, and $R^3$, i.e., all of the silicon atom-bonded organic groups, are the alkenyl groups, and preferably vinyl groups. Furthermore, in a molecule, at least one of the groups represented by $R^3$ is the aryl group or the aralkyl group, and preferably a phenyl group.

Furthermore, in the formula, a, b, and c are numbers satisfying: $0.01 \leq a \leq 0.5$, $0.4 \leq b \leq 0.8$, $0.01 \leq c \leq 0.5$, and $a+b+c=1$, and preferably $0.01 \leq a \leq 0.4$, $0.45 \leq b \leq 0.8$, $0.05 \leq c \leq 0.5$, and $a+b+c=1$, or $0.01 \leq a \leq 0.3$, $0.45 \leq b \leq 0.75$, $0.1 \leq c \leq 0.5$, and $a+b+c=1$. This is because, when a is not less than the lower limit of the range described above, stickiness is less likely to occur on the cured product, and on the other hand, when a is not greater than the upper limit of the range described above, excellent strength of the cured product is achieved. Furthermore, when b is not less than the lower limit of the range described above, excellent affinity of the cured product to a phosphor is achieved, and on the other hand, when b is not greater than the upper limit of the range described above, mechanical characteristics of the cured product are enhanced. Furthermore, when c is not less than the lower limit of the range described above, excellent refractive index of the cured product is achieved and thus excellent gas barrier properties are achieved, and on the other hand, when c is not greater than the upper limit of the range described above, mechanical characteristics of the cured product are enhanced.

The method of preparing the organopolysiloxane for component (A) is not particularly limited, and examples thereof include a method of subjecting a silane (I) represented by the general formula:

$$R^3SiX_3$$

a silane (II-1) represented by the general formula:

$$R^2{}_2SiX_2$$

and a disiloxane (III-1) represented by the general formula:

$$R^1{}_3SiOSiR^1{}_3$$

to hydrolysis/condensation reaction in the presence of an acid or alkali.

The silane (I) is a raw material for introducing siloxane units represented by formula: $R^3SiO_{3/2}$ to the resulting organopolysiloxane. In the formula, $R^3$ is an alkyl group having from 1 to 12 carbons, aryl group having from 6 to 20 carbons, or an aralkyl group having from 7 to 20 carbons, and examples thereof are the same as the groups described above. Furthermore, in the formula, X is an alkoxy group, acyloxy group, halogen atom, or a hydroxyl group. Specific examples thereof include alkoxy groups, such as a methoxy group, ethoxy group, and propoxy group; acyloxy groups, such as an acetoxy group; and halogen atoms, such as a chlorine atom and a bromine atom.

Examples of the silane (I) include alkoxy silanes, such as phenyl trimethoxysilane, naphthyl trimethoxysilane, anthracenyl trimethoxysilane, phenanthryl trimethoxysilane, pyrenyl trimethoxysilane, phenyl triethoxysilane, naphthyl triethoxysilane, anthracenyl triethoxysilane, phenanthryl triethoxysilane, pyrenyl triethoxysilane, methyl trimethoxysilane, ethyl trimethoxysilane, and methyl triethoxysilane; acyloxysilanes, such as phenyl triacetoxysilane, naphthyl triacetoxysilane, anthracenyl triacetoxysilane, phenanthryl triacetoxysilane, pyrenyl triacetoxysilane, methyl triacetoxysilane, and ethyl triacetoxysilane; halosilanes, such as phenyl trichlorosilane, naphthyl trichlorosilane, anthracenyl trichlorosilane, phenanthryl trichlorosilane, pyrenyl trichlorosilane, methyl trichlorosilane, and ethyl trichlorosilane; and hydroxysilanes, such as phenyl trihydroxysilane, naphthyl trihydroxysilane, anthracenyl trihydroxysilane, phenanthryl trihydroxysilane, pyrenyl trihydroxysilane, methyl trihydroxysilane, and ethyl trihydroxysilane.

The silane (II-1) is a raw material for introducing siloxane units represented by formula: $R^2_2SiO_{2/2}$ to the resulting organopolysiloxane. In the formula, $R^2$ are the same or different, and alkyl groups having from 1 to 12 carbons or alkenyl groups having from 2 to 12 carbons, and examples thereof are the same as the groups described above. Furthermore, in the formula, X is an alkoxy group, acyloxy group, halogen atom, or a hydroxyl group; and examples thereof are the same as the groups described above.

Examples of the silane (II-1) include dialkoxysilanes, such as dimethyldimethoxysilane, diethyldimethoxysilane, dipropyldimethoxysilane, methylethyldimethoxysilane, methylvinyldimethoxysilane, dimethyldiethoxysilane, diethyldiethoxysilane, dipropyldiethoxysilane, methylethyldiethoxysilane, and methylvinyldiethoxysilane; diacyloxysilanes, such as dimethyldiacetoxysilane, methylethyldiacetoxysilane, and methylvinyldiacetoxysilane; dihalosilanes, such as dimethyldichlorosilane, diethyldichlorosilane, dipropyldichlorosilane, methylethyldichlorosilane, and methylvinyldichlorosilane; and dihydroxysilanes, such as dimethyldihydroxysilane, diethyldihydroxysilane, dipropyldihydroxysilane, methylethyldihydroxysilane, and methylvinyldihydroxysilane.

Furthermore, the disiloxane (III-1) is a raw material for introducing siloxane units represented by formula: $R^1_3SiO_{1/2}$ to the resulting organopolysiloxane. In the formula, $R^1$ are the same or different, and alkyl groups having from 1 to 12 carbons, alkenyl groups having from 2 to 12 carbons, aryl groups having from 6 to 20 carbons, or aralkyl groups having from 7 to 20 carbons, and examples thereof are the same as the groups described above.

Examples of the disiloxane (III-1) include 1,1,1,3,3,3-hexamethyldisiloxane, 1,3-divinyl-1,1,3,3-tetramethyldisiloxane, 1,3-divinyl-1,1,3,3-tetraethyldisiloxane, 1,1,3,3-tetravinyl-1,3-dimethyldisiloxane, 1,1,1,3,3,3-hexavinyldisiloxane, 1,3-diphenyl-1,3-divinyl-1,3-dimethyldisiloxane, and 1,1,3,3-tetraphenyl-1,3-divinyldisiloxane.

In the method described above, in place of the silane (II-1) or in addition to the silane (II-1), a cyclic siloxane (II-2) represented by the general formula:

$(R^2_2SiO)_p$ may be used. In the formula, $R^2$ are the same or different, and alkyl groups having from 1 to 12 carbons or alkenyl groups having from 2 to 12 carbons, and examples thereof are the same as the groups described above. Furthermore, in the formula, p is an integer of 3 or greater.

Examples of the cyclic siloxane (II-2) include 1,1,3,3,5,5,7,7-octamethylcyclotetrasiloxane, 1,3,5,7-tetravinyl-1,3,5,7-tetramethylcyclotetrasiloxane, and 1,1,3,3,5,5,7,7-octaethylcyclotetrasiloxane.

Furthermore, in the method described above, in place of the silane (II-1) and the cyclic siloxane (II-2) or in addition to the silane (II-1) and/or the cyclic siloxane (II-2), a straight-chain siloxane (II-3) represented by the general formula:

$HO(R^2_2SiO)_qH$ may be used. In the formula, $R^2$ are the same or different, and alkyl groups having from 1 to 12 carbons or alkenyl groups having from 2 to 12 carbons, and examples thereof are the same as the groups described above. Furthermore, in the formula, q is an integer of 2 or greater.

Examples of the straight-chain siloxane (II-3) include dimethylsiloxane oligomers capped at both molecular terminals with silanol groups, methylvinylsiloxane oligomers capped at both molecular terminals with silanol groups, diethylsiloxane oligomers capped at both molecular terminals with silanol groups, and dipropylsiloxane oligomers capped at both molecular terminals with silanol groups.

Furthermore, in the method described above, in place of the disiloxane (III-1) or in addition to the disiloxane (III-1), a silane (III-2) represented by the general formula:

$R^1_3SiX$ may be used. In the formula, $R^1$ are the same or different, and alkyl groups having from 1 to 12 carbons, alkenyl groups having from 2 to 12 carbons, aryl groups having from 6 to 20 carbons, or aralkyl groups having from 7 to 20 carbons, and examples thereof are the same as the groups described above. Furthermore, in the formula, X is an alkoxy group, acyloxy group, halogen atom, or a hydroxyl group; and examples thereof are the same as the groups described above.

Examples of the silane (III-2) include alkoxysilanes, such as trimethylmethoxysilane, triethylmethoxysilane, dimethylvinylmethoxysilane, diethylvinylmethoxysilane, dimethylvinylethoxysilane, diethylvinylethoxysilane, divinylmethylmethoxysilane, trivinylmethoxysilane, methylphenylvinylmethoxysilane, methyldiphenylmethoxysilane, and diphenylvinylmethoxysilane; acyloxysilanes, such as trimethylacetoxysilane, dimethylvinylacetoxysilane, diethylvinylacetoxysilane, divinylmethylacetoxysilane, trivinylacetoxysilane, methylphenylvinylacetoxysilane, methyldiphenylacetoxysilane, and diphenylvinylacetoxysilane; halosilanes, such as trimethylchlorosilane, dimethylvinylchlorosilane, diethylvinylchlorosilane, divinylmethylchlorosilane, trivinylchlorosilane, methylphenylvinylchlorosilane, and methyldiphenylchlorosilane; and hydroxysilanes, such as trimethylhydroxysilane, dimethylvinylhydroxysilane, diethylvinylhydroxysilane, divinylmethylhydroxysilane, trivinylhydroxysilane, methylphenylvinylhydroxysilane, and methyldiphenylhydroxysilane.

In the method described above, the silane (I), the silane (II-1), and the disiloxane (III-1); or the cyclic siloxane (II-2) and/or the straight-chain siloxane (II-3) in place of or in addition to the silane (II-1); or the silane (III-2) in place of or in addition to the disiloxane (III-1); are subjected to hydrolysis/condensation reaction in the presence of an acid or alkali. Note that at least one type of the silane (I) used in the method described above is a silane having an aryl group having from 6 to 20 carbons or aralkyl group having from 7 to 20 carbons, and at least one type of the silane (II-1), cyclic siloxane (II-2), straight-chain siloxane (II-3), disiloxane (III-1), or silane compound (III-2) is a substance having an alkenyl group having from 2 to 12 carbons.

Furthermore, examples of the acid used in the method described above include hydrochloric acid, acetic acid, formic acid, nitric acid, oxalic acid, sulfuric acid, phosphoric acid, polyphosphoric acid, polycarboxylic acid, trifluoromethane sulfonic acid, and ion exchange resins. Furthermore, examples of the alkali used in the method described above include inorganic alkalis, such as potassium hydroxide and sodium hydroxide; and organic base compounds, such as triethylamine, diethylamine, monoethanolamine, diethanolamine, triethanolamine, ammonia water, tetramethylammonium hydroxide, alkoxysilanes having an amino group, and aminopropyltrimethoxysilane.

In the method described above, an organic solvent may be also used. Examples of the organic solvent include ethers, ketones, acetates, aromatic or aliphatic hydrocarbons, and γ-butyrolactone; and mixtures of two or more types of these solvents. Preferred organic solvents are exemplified by propylene glycol monomethyl ether, propylene glycol monomethyl ether acetate, propylene glycol monoethyl ether, propylene glycol monopropyl ether, propylene glycol monobutyl ether, propylene glycol mono-t-butyl ether, γ-butyrolactone, toluene, and xylene.

In order to accelerate the hydrolysis/condensation reaction in the method described above, water or a mixed solution of water and an alcohol is preferably added. Methanol and ethanol are preferred as examples of the alcohol. If an organic solvent is used and this reaction is promoted by heating, the reaction is preferably performed at the reflux temperature of the organic solvent.

Component (B) is an organopolysiloxane represented by the average unit formula:

$$(R^4_3SiO_{1/2})_d(R^4_2SiO_{2/2})_e(R^4SiO_{3/2})_f(SiO_{4/2})_g.$$

In the formula, $R^4$ are the same or different, and alkyl groups having from 1 to 12 carbons, alkenyl groups having from 2 to 12 carbons, aryl groups having from 6 to 20 carbons, or aralkyl groups having from 7 to 20 carbons. Specific examples thereof include alkyl groups, such as a methyl group, ethyl group, propyl group, butyl group, pentyl group, hexyl group, heptyl group, octyl group, nonyl group, decyl group, undecyl group, and a dodecyl group; alkenyl groups, such as a vinyl group, allyl group, butenyl group, pentenyl group, hexenyl group, heptenyl group, octenyl group, nonenyl group, decenyl group, undecenyl group, and a dodecenyl group; aryl groups, such as a phenyl group, tolyl group, xylyl group, naphthyl group, anthracenyl group, phenanthryl group, and a pyrenyl group; aralkyl groups, such as a benzyl group, phenethyl group, naphthylethyl group, naphthylpropyl group, anthracenylethyl group, phenanthrylethyl group, and a pyrenylethyl group; and groups in which some or all of the hydrogen atoms bonded in these groups are substituted with halogen atoms, such as a chlorine atom and a bromine atom. However, in a molecule, at least 0.5 mol % of the total content of the groups represented by $R^4$, i.e., all of the silicon atom-bonded organic groups, are the alkenyl groups, and preferably vinyl groups.

Furthermore, in the formula, d, e, f, and g are numbers satisfying: $0.01 \leq d \leq 0.5$, $0 \leq e \leq 0.9$, $0 \leq f \leq 0.9$, $0 \leq g \leq 0.9$, and $d+e+f+g=1$; however, if f is a number satisfying: $0 \leq f \leq 0.5$, g is a number satisfying: $0 < g \leq 0.9$. Furthermore, preferably d, e, f, and g are numbers satisfying: $0.05 \leq d \leq 0.4$, $0 \leq e \leq 0.8$, $0 \leq f \leq 0.8$, $0 \leq g \leq 0.8$, and $d+e+f+g=1$; however, if f is a number satisfying: $0 \leq f \leq 0.5$, g is a number satisfying: $0 < g \leq 0.8$. This is because, when d is not less than the lower limit of the range described above, excellent strength of the cured product is achieved, and on the other hand, when d is not greater than the upper limit of the range described above, excellent viscosity of the composition is achieved. Furthermore, when e is not less than the lower limit of the range described above, excellent flexibility of the cured product is achieved, and on the other hand, when e is not greater than the upper limit of the range described above, excellent miscibility of the cured product to phosphor is achieved. Furthermore, when f is not less than the lower limit of the range described above, mechanical properties of the cured product are enhanced, and on the other hand, when f is not greater than the upper limit of the range described above, excellent viscosity of the composition is achieved. Furthermore, when g is not less than the lower limit of the range described above, excellent strength of the cured product is achieved, and on the other hand, when g is not greater than the upper limit of the range described above, excellent mechanical properties of the cured product are achieved.

Examples of the method of preparing component (B) include a method of subjecting a silane (IV) represented by the general formula:

$$R^4SiX_3$$

and/or a silane (V) represented by the general formula:

$$SiX_4$$

and a disiloxane (VI-1) represented by the general formula:

$$R^4_3SiOSiR^4_3$$

to hydrolysis/condensation reaction in the presence of an acid or alkali.

The silane (IV) is a raw material for introducing siloxane units represented by formula: $R^4SiO_{3/2}$ to the resulting organopolysiloxane. In the formula, $R^4$ is an alkyl group having from 1 to 12 carbons or an alkenyl group having from 2 to 12 carbons, and examples thereof are the same as the groups described above. Furthermore, in the formula, X is an alkoxy group, acyloxy group, halogen atom, or a hydroxyl group; and examples thereof are the same as the groups described above.

Examples of the silane (IV) include alkoxysilanes, such as methyltrimethoxysilane, ethyltrimethoxysilane, vinyltrimethoxysilane, vinyltriethoxysilane, and allyltrimethoxysilane; acyloxysilanes, such as methyltriacetoxysilane, ethyltriacetoxysilane, and vinyltriacetoxysilane; halosilanes, such as methyltrichlorosilane, ethyltrichlorosilane, and vinyltrichlorosilane; and hydroxysilanes, such as methyltrihydroxysilane, ethyltrihydroxysilane, and vinyltrihydroxysilane.

Furthermore, the silane (V) is a raw material for introducing siloxane units represented by formula: $SiO_{4/2}$ to the resulting organopolysiloxane. In the formula, X is an alkoxy group, acyloxy group, halogen atom, or a hydroxyl group, and examples thereof are the same as the groups described above.

Examples of the silane (V) include alkoxysilanes, such as tetramethoxysilane and tetraethoxysilane; acyloxysilanes, such as tetraacetoxysilane; halosilanes, such as tetrachlorosilane; and hydroxysilanes, such as tetrahydroxysilane.

Furthermore, the disiloxane (VI-1) is a raw material for introducing siloxane units represented by formula: $R^4_3SiO_{1/2}$ to the resulting organopolysiloxane. In the formula, $R^4$ are alkyl groups having from 1 to 12 carbons or alkenyl groups having from 2 to 12 carbons, and examples thereof are the same as the groups described above. Furthermore, in the formula, X is an alkoxy group, acyloxy group, halogen atom, or a hydroxyl group; and examples thereof are the same as the groups described above.

Examples of the disiloxane (VI-1) include 1,1,1,3,3,3-hexamethyldisiloxane, 1,3-divinyl-1,1,3,3-tetramethyldisiloxane, and 1,1,3,3-tetravinyl-1,3-dimethyldisiloxane.

In the method described above, in place of the disiloxane (VI-1) or in addition to the disiloxane (VI-1), a silane (VI-2) represented by general formula:

$$R^4{}_3SiX$$

may be used. In the formula, $R^4$ are alkyl groups having from 1 to 12 carbons or alkenyl groups having from 2 to 12 carbons, and examples thereof are the same as the groups described above. Moreover, in the formula, X is an alkoxy group, an acyloxy group, a halogen atom, or a hydroxyl group; and examples thereof are the same as the groups described above.

Examples of the silane (VI-2) include alkoxysilanes, such as trimethylmethoxysilane, triethylmethoxysilane, vinyldimethylmethoxysilane, divinylmethylmethoxysilane, and trimethylethoxysilane; acyloxysilanes, such as trimethylacetoxysilane, triethylacetoxysilane, and vinyldimethylacetoxysilane; halosilanes, such as trimethylchlorosilane, triethyltrichlorosilane, and vinyldimethylchlorosilane; and hydroxysilanes, such as trimethylhydroxysilane, triethylhydroxysilane, and vinyldimethylhydroxysilane.

To introduce siloxane units represented by $R^4{}_2SiO_{2/2}$ to the resulting organopolysiloxane in the above described method, the silane (II-1), the cyclic siloxane (II-2), the straight-chain siloxane (II-3), or a mixture of at least two types of these may be reacted. Note that at least one type of the silane compound (IV), the disiloxane (VI-1), the silane compound (VI-2), the silane compound (II-1), the cyclic siloxane compound (II-2), and the straight-chain siloxane (II-3) used in the method described above has an alkenyl group having from 2 to 12 carbons.

Examples of the acid and alkali used in the method described above are the same as those described above. In the method described above, an organic solvent may also be used. Examples of the organic solvent are the same as those described above.

In order to accelerate the hydrolysis/condensation reaction in the method described above, water or a mixed solution of water and an alcohol is preferably added. Methanol and ethanol are preferred examples of the alcohol. If an organic solvent is used and this reaction is promoted by heating, the reaction is preferably performed at the reflux temperature of the organic solvent.

In the present composition, the content of component (B) is in a range of 20 to 1,000 parts by mass, preferably 30 to 900 parts by mass or 40 to 800 parts by mass, per 100 parts by mass of component (A). This is because, when the content of component (B) is not less than the lower limit of the range described above, mechanical properties of the cured product are enhanced, and on the other hand, when the content of component (B) is not greater than the upper limit of the range described above, excellent viscosity of the composition is achieved.

Component (C) is an organopolysiloxane having at least two silicon atom-bonded hydrogen atoms in a molecule. Examples of the molecular structure of component (C) include straight chain, partially branched straight chain, branched chain, cyclic, and dendritic structures. Of these, straight chain, partially branched straight chain, and dendritic structures are preferable. The bonding positions of the silicon atom-bonded hydrogen atoms in component (C) are not particularly limited, and examples thereof include a molecular terminal(s) and/or side chain(s) of the molecule. Furthermore, examples of groups bonding to silicon atoms, excluding hydrogen atom, in component (C) include alkyl groups, such as a methyl group, ethyl group, propyl group, butyl group, pentyl group, hexyl group, heptyl group, octyl group, nonyl group, decyl group, undecyl group, and a dodecyl group; aralkyl groups, such as a benzyl group, phenethyl group, naphthylethyl group, naphthylpropyl group, anthracenylethyl group, phenanthrylethyl group, and a pyrenylethyl group; halogenated alkyl groups, such as a chloromethyl group, 3-chloropropyl group, and 3,3,3-trifluoropropyl group; glycidoxyalkyl groups, such as 3-glycidoxypropyl group and 4-glycidoxybutyl group; and epoxycyclohexylalkyl groups, such as 2-(3,4-epoxycyclohexyl)ethyl group and 3-(3,4-epoxycyclohexyl)propyl group. The viscosity at 25° C. of component (C) is not particularly limited; however, the viscosity is preferably in a range of 1 to 10,000 mPa·s or in a range of 1 to 1,000 mPa·s.

Examples of component (C) include 1,1,3,3-tetramethyldisiloxane, 1,3,5,7-tetramethylcyclotetrasiloxane, tris(dimethylhydrogensiloxy)methylsilane, tris(dimethylhydrogensiloxy)phenylsilane, 1-(3-glycidoxypropyl)-1,3,5,7-tetramethylcyclotetrasiloxane, 1,5-di(3-glycidoxypropyl)-1,3,5,7-tetramethylcyclotetrasiloxane, 1-(3-glycidoxypropyl)-5-trimethoxysilylethyl-1,3,5,7-tetramethylcyclotetrasiloxane, methylhydrogenpolysiloxane capped at both molecular terminals with trimethylsiloxy groups, dimethylsiloxane-methylhydrogensiloxane copolymers capped at both molecular terminals with trimethylsiloxy groups, dimethylpolysiloxane capped at both molecular terminals with dimethylhydrogensiloxy groups, diphenylpolysiloxane capped at both molecular terminals with dimethylhydrogensiloxy groups, dimethylsiloxane-methylhydrogensiloxane copolymers capped at both molecular terminals with dimethylhydrogensiloxy groups, methylhydrogensiloxane-diphenylsiloxane copolymers capped at both molecular terminals with trimethylsiloxy groups, methylhydrogensiloxane-diphenylsiloxane-dimethylsiloxane copolymers capped at both molecular terminals with trimethylsiloxy groups, hydrolysis condensates of trimethoxysilane, copolymers consisting of $(CH_3)_2HSiO_{1/2}$ units and $SiO_{4/2}$ units, copolymers consisting of $(CH_3)_2HSiO_{1/2}$ units, $SiO_{4/2}$ units, and $(C_6H_5)SiO_{3/2}$ units, and a mixture of at least two types of these.

Furthermore, examples of component (C) include the following organosiloxanes. Note that, in the formulae, Me, Vi, Ph, and Naph represent a methyl group, vinyl group, phenyl group, and a naphthyl group, respectively; m and m' are each independently an integer of 1 or greater; and h, i, j, and k are numbers satisfying: $0<h<1$, $0<i<1$, $0<j<1$, $0<k<1$, and $h+i+j+k=1$.

$HMe_2SiO(Ph_2SiO)_mSiMe_2H$
$HMePhSiO(Ph_2SiO)_mSiMePhH$
$HMeNaphSiO(Ph_2SiO)_mSiMeNaphH$
$HMePhSiO(Ph_2SiO)_m(MePhSiO)_{m'}SiMePhH$
$HMePhSiO(Ph_2SiO)_m(Me_2SiO)_{m'}SiMePhH$
$(HMe_2SiO_{1/2})_h(PhSiO_{3/2})_i$
$(HMePhSiO_{1/2})_h(PhSiO_{3/2})_i$
$(HMePhSiO_{1/2})_h(NaphSiO_{3/2})_i$
$(HMe_2SiO_{1/2})_h(NaphSiO_{3/2})_i$
$(HMePhSiO_{1/2})_h(HMe_2SiO_{1/2})_i(PhSiO_{3/2})_j$
$(HMe_2SiO_{1/2})_h(SiO_{4/2})_i$
$(HMe_2SiO_{1/2})_h(SiO_{4/2})_i(PhSiO_{3/2})_j$
$(HMePhSiO_{1/2})_h(SiO_{4/2})_i(PhSiO_{3/2})_j$ $(HMe_2SiO_{1/2})_h(SiO_{4/2})_i(NaphSiO_{3/2})_j$
$(HMePhSiO_{1/2})_h(SiO_{4/2})_i(NaphSiO_{3/2})_j$
$(HMePhSiO_{1/2})_n(HMe_2SiO_{1/2})_i(NaphSiO_{3/2})_j$
$(HMePhSiO_{1/2})_n(HMe_2SiO_{1/2})_i(SiO_{4/2})_i(NaphSiO_{3/2})_k$
$(HMePhSiO_{1/2})_n(HMe_2SiO_{1/2})_i(SiO_{4/2})_j(PhSiO_{3/2})_k$ The content of component (C) in the present composition is an amount such that the silicon atom-bonded hydrogen atoms contained in component (C) is in a range of 0.1 to 10 mol, and preferably in a range of 0.5 to 5 mol, per 1 mol of total alkenyl groups contained in components (A) and (B). This is because, when the content of component (C) is not less than the lower limit of the range described above, the resulting composition is cured sufficiently, and on the other hand, when the content is not greater than the upper limit of the range described above, heat resistance of the resulting cured product is enhanced, and reliability of an optical semiconductor device produced using this composition is thus enhanced.

Component (D) is a hydrosilylation reaction catalyst used to accelerate curing of the present composition. Examples of component (D) include platinum-based catalysts, rhodium-based catalysts, and palladium-based catalysts. The platinum-based catalyst is preferable. Examples of the platinum-based catalyst include platinum-based compounds, such as platinum fine powder, platinum black, platinum-supporting silica fine powder, platinum-supporting activated carbon, chloroplatinic acid, alcohol solutions of chloroplatinic acid, olefin complexes of platinum, and alkenylsiloxane complexes of platinum.

The content of component (D) in the present composition is an amount that accelerates curing the present composition. Specifically, the content of component (D) in the present composition is an amount such that the amount of the metal atoms in this catalyst is in a range of 0.01 to 1,000 ppm by mass. This is because, when the content of component (D) is not less than the lower limit of the range described above, the resulting composition is cured sufficiently, and on the other hand, when the content of component (D) is not greater than the upper limit of the range described above, the resulting cured product is resistant to discoloration.

The present composition may contain (E) a hydrosilylation reaction inhibitor in order to prolong the usable time at ambient temperature and to enhance storage stability. Examples of component (E) include alkyne alcohols, such as 1-ethynylcyclohexan-1-ol, 2-methyl-3-butyn-2-ol, 3,5-dimethyl-1-hexyn-3-ol, and 2-phenyl-3-butyn-2-ol; enyne compounds, such as 3-methyl-3-penten-1-yne and 3,5-dimethyl-3-hexen-1-yne; methylalkenylsiloxane oligomers, such as 1,3,5,7-tetramethyl-1,3,5,7-tetravinylcyclotetrasiloxane and 1,3,5,7-tetramethyl-1,3,5,7-tetrahexenylcyclotetrasiloxane; alkynoxysilanes, such as dimethyl bis-(3-methyl-1-butyn-3-oxy)silane and methylvinyl bis-(3-methyl-1-butyn-3-oxy) silane; and triallylisocyanurate-based compounds.

The content of component (E) is not particularly limited; however, the content is preferably in a range of 0.01 to 3 parts by mass or in a range of 0.01 to 1 part by mass, per 100 parts by mass of the total amount of components (A) to (C). This is because, when the content of component (E) is not less than the lower limit of the range described above, suitable usable life of the present composition is ensured, and on the other hand, when the content is not greater than the upper limit of the range described above, suitable workability of the present composition is ensured.

Furthermore, the present composition may contain (F) an adhesion promoter in order to further enhance adhesion to a substrate with which the composition makes contact during curing. Component (F) is preferably an organosilicon compound having at least one alkoxy group bonded to a silicon atom in a molecule. Examples of the alkoxy group include a methoxy group, ethoxy group, propoxy group, butoxy group, and a methoxyethoxy group. The methoxy group and ethoxy group are preferable. Furthermore, examples of other group(s), excluding alkoxy group, that bond to a silicon atom of the organosilicon compound include alkyl groups, such as a methyl group, ethyl group, propyl group, butyl group, pentyl group, hexyl group, heptyl group, octyl group, nonyl group, decyl group, undecyl group, and a dodecyl group; alkenyl groups, such as a vinyl group, allyl group, butenyl group, pentenyl group, hexenyl group, heptenyl group, octenyl group, nonenyl group, decenyl group, undecenyl group, and a dodecenyl group; aryl groups, such as a phenyl group, tolyl group, xylyl group, naphthyl group, anthracenyl group, phenanthryl group, and a pyrenyl group; aralkyl groups, such as a benzyl group, phenethyl group, naphthylethyl group, naphthylpropyl group, anthracenylethyl group, phenanthrylethyl group, and a pyrenylethyl group; groups in which some or all of the hydrogen atoms bonded in these groups are substituted with halogen atoms, such as a chlorine atom and a bromine atom; glycidoxyalkyl groups, such as 3-glycidoxypropyl group and 4-glycidoxybutyl group; epoxycyclohexylalkyl groups, such as 2-(3,4-epoxycyclohexyl)ethyl group and 3-(3,4-epoxycyclohexyl) propyl group; oxiranylalkyl groups, such as 4-oxiranylbutyl group and 8-oxiranyloctyl group; acryloxyalkyl groups, such as 3-methacryloxypropyl group; and isocyanate groups, isocyanurate groups, and hydrogen atoms.

The organosilicon compound preferably has a group that can react with an alkenyl group or a silicon atom-bonded hydrogen atom in the present composition. Specifically, the organosilicon compound preferably has a silicon atom-bonded hydrogen atom or an alkenyl group. Examples of the molecular structure of the silicon compound include straight chain, partially branched straight chain, branched chain, cyclic, and net-like structures. Of these, straight chain, branched chain, and net-like structures are preferable. Examples of such an organosilicon compound include silane compounds, such as 3-glycidoxypropyltrimethoxysilane, 2-(3,4-epoxycyclohexyl)ethyltrimethoxysilane, and 3-methacryloxy propyltrimethoxysilane; siloxane compounds having at least one of silicon atom-bonded alkenyl groups or at least one silicon atom-bonded hydrogen atoms, and at least one silicon atom-bonded alkoxy group in a molecule; mixtures of a silane compound or siloxane compound having at least one silicon atom-bonded alkoxy group and a siloxane compound having at least one silicon atom-bonded hydroxyl group and at least one silicon atom-bonded alkenyl group in a molecule; siloxane compounds represented by the average unit formula:

[Chemical Formula 1]

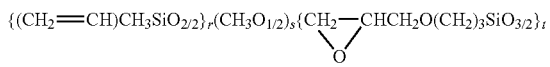

(in the formula, r, s, and t each independently represent a positive number); and siloxane compounds represented by the average unit formula:

[Chemical Formula 2]

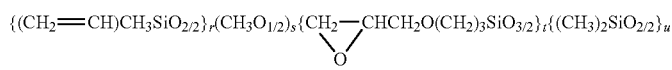

(in the formula, r, s, t, and u each independently represent a positive number).

The content of component (F) is not particularly limited; however, the content is preferably in a range of 0.1 to 5 parts by mass or in a range of 1 to 5 parts by mass, per 100 parts by mass of the total amount of components (A) to (C). This is because, when the content of component (F) is not less than the lower limit of the range described above, excellent adhesion is achieved, and on the other hand, when the content is not greater than the upper limit of the range described above, excellent storage stability is achieved.

Furthermore, the present composition may contain (G) a phosphor in order to convert the emission wavelength from an optical semiconductor element. Examples of component (G) include substances widely used in light emitting diodes (LEDs), such as yellow, red, green, and blue light-emitting phosphors, such as oxide-based phosphors, oxynitride-based phosphors, nitride-based phosphors, sulfide-based phosphors, and oxysulfide-based phosphors. Examples of oxide-based phosphors include yttrium, aluminum, and garnet-type YAG green to yellow light-emitting phosphors containing cerium ions; terbium, aluminum, and garnet-type TAG yellow light-emitting phosphors containing cerium ions; and silicate green to yellow light-emitting phosphors containing cerium or europium ions. Examples of oxynitride-based phosphors include silicon, aluminum, oxygen, and nitrogen-type SiAlON red to green light-emitting phosphors containing europium ions. Examples of nitride-based phosphors include calcium, strontium, aluminum, silicon, and nitrogen-type CASN red light-emitting phosphors containing europium ions. Examples of sulfide-based phosphors include ZnS green light-emitting phosphors containing copper ions or aluminum ions. Examples of oxysulfide-based phosphors include $Y_2O_2S$ red light-emitting phosphors containing europium ions. Two or more types of these phosphors may be combined for use.

The average particle diameter of component (G) is not particularly limited; however, the average particle diameter is preferably in a range of 1 to 50 μm or in a range of 5 to 20 μm. This is because, when the average particle diameter of component (G) is not less than the lower limit of the range described above, increase in viscosity upon mixing is suppressed, and on the other hand, when the average particle diameter is not greater than the upper limit of the range described above, excellent light transmittance is achieved.

The content of component (G) is in a range of 0.1 to 70% by mass, and preferably in a range of 1 to 70% by mass or in a range of 5 to 70% by mass, relative to the total amount of components (A) to (C). This is because, when the content of component (G) is not less than the lower limit of the range described above, wavelength conversion can be performed efficiently, and on the other hand, when the content is not greater than the upper limit of the range described above, handleability of the resulting composition is enhanced.

In order to sufficiently suppress the discoloration of silver electrodes or silver plating of a substrate in an optical semiconductor device due to sulfur-containing gas in the air, the present composition may contain at least one type of a fine powder having an average particle diameter of 0.1 nm to 5 μm selected from the group consisting of zinc oxide fine powders surface-coated with at least one type of oxide of an element selected from the group consisting of Al, Ag, Cu, Fe, Sb, Si, Sn, Ti, Zr, and rare earth elements, zinc oxide fine powders surface-treated with organosilicon compounds having no alkenyl groups, and hydrate fine powders of zinc carbonate.

In a zinc oxide fine powder surface-coated with an oxide, examples of rare earth elements include yttrium, cerium, and europium. Examples of oxides on the surface of the zinc oxide fine powder include $Al_2O_3$, $AgO$, $Ag_2O$, $Ag_2O_3$, $CuO$, $Cu_2O$, $FeO$, $Fe_2O_3$, $Fe_3O_4$, $Sb_2O_3$, $SiO_2$, $SnO_2$, $Ti_2O_3$, $TiO_2$, $Ti_3O_5$, $ZrO_2$, $Y_2O_3$, $CeO_2$, $Eu_2O_3$, and mixtures of two or more types of these oxides.

The content of the powder is not particularly limited; however, the content is preferably in a range of 1 ppm to 10% or in a range of 1 ppm to 5%, by mass, of the present composition. This is because, when the content of the powder is not less than the lower limit of the range described above, discoloration of silver electrodes or silver plating of a substrate in an optical semiconductor device due to a sulfur-containing gas is sufficiently suppressed, and on the other hand, when the content is not greater than the upper limit of the range described above, fluidity of the resulting composition is not diminished.

Furthermore, the present composition may also contain a triazole-based compound to enable further suppression of the discoloration of silver electrodes or silver plating of a substrate in an optical semiconductor device due to a sulfur-containing gas in the air. Examples of the triazole-based compound include 1H-1,2,3-triazole, 2H-1,2,3-triazole, 1H-1,2,4-triazole, 4H-1,2,4-triazole, 2-(2'-hydroxy-5-methylphenyl)benzotriazole, 1H-1,2,3-triazole, 2H-1,2,3-triazole, 1H-1,2,4-triazole, 4H-1,2,4-triazole, benzotriazole, tolyltriazole, carboxybenzotriazole, 1H-benzotriazole-5-methylcarboxylate, 3-amino-1,2,4-triazole, 4-amino-1,2,4-triazole, 5-amino-1,2,4-triazole, 3-mercapto-1,2,4-triazole, chlorobenzotriazole, nitrobenzotriazole, aminobenzotriazole, cyclohexano[1,2-d]triazole, 4,5,6,7-tetrahydroxytolyltriazole, 1-hydroxybenzotriazole, ethylbenzotriazole, naphthotriazole, 1-N, N-bis(2-ethylhexyl)-[(1,2,4-triazol-1-yl)methyl]amine, 1-[N, N-bis(2-ethylhexyl)aminomethyl]benzotriazole, 1-[N, N-bis(2-ethylhexyl)aminomethyl]tolyltriazole, 1-[N, N-bis(2-ethylhexyl)aminomethyl]carboxybenzotriazole, 1-[N, N-bis(2-hydroxyethyl)-aminomethyl]benzotriazole, 1-[N, N-bis(2-hydroxyethyl)-aminomethyl]tolyltriazole, 1-[N, N-bis(2-hydroxyethyl)-aminomethyl]carboxybenzotriazole, 1-[N, N-bis(2-hydroxypropyl)aminomethyl]carboxybenzotriazole, 1-[N, N-bis(1-butyl)aminomethyl]carboxybenzotriazole, 1-[N,N-bis(1-octyl)aminomethyl]carboxybenzotriazole, 1-(2',3'-dihydroxypropyl)benzotriazole, 1-(2',3'-di-carboxyethyl) benzotriazole, 2-(2'-hydroxy-3',5'-di-tert-butylphenyl) benzotriazole, 2-(2'-hydroxy-3',5'-aminophenyl) benzotriazole, 2-(2'-hydroxy-4'-octoxyphenyl) benzotriazole, 2-(2'-hydroxy-5'-tert-butylphenyl) benzotriazole, 1-hydroxybenzotriazole-6-carboxylic acid, 1-oleoylbenzotriazole, 1,2,4-triazol-3-ol, 5-amino-3-mercapto-1,2,4-triazole, 5-amino-1,2,4-triazole-3-carboxylic acid, 1,2,4-triazole-3-carboxyamide, 4-aminourazole, and 1,2,4-triazol-5-one. The content of the triazole-based compound is not particularly limited; however, the content is in a range of 0.01 ppm to 3% by mass, and preferably in a range of 0.1 ppm to 1% by mass, of the present composition.

Furthermore, the present composition may contain a straight-chain organopolysiloxane having at least two silicon atom-bonded alkenyl groups in a molecule. Examples of the alkenyl group include a vinyl group, allyl group, butenyl group, pentenyl group, hexenyl group, heptenyl group, octenyl group, nonenyl group, decenyl group, undecenyl group, and a dodecenyl group. Of these, the vinyl group is preferable. Examples of the group bonding to the silicon atom other than alkenyl groups include alkyl groups, such as a methyl group, ethyl group, propyl group, butyl group, pentyl group, hexyl group, heptyl group, octyl group, nonyl group, decyl group, undecyl group, and a dodecyl group; aryl groups, such as a phenyl group, tolyl group, xylyl group, naphthyl group, anthracenyl group, phenanthryl group, and a pyrenyl group; aralkyl groups, such as a benzyl group, phenethyl group, naphthylethyl group, naphthylpropyl group, anthracenylethyl group, phenanthrylethyl group, and a pyrenylethyl group; and groups in which some or all of the hydrogen atoms bonded in these groups are substituted with halogen atoms, such as a chlorine atom and a bromine atom. Of these, the methyl group and phenyl group are preferable. The viscosity at 25° C. of the organopolysiloxane is not particularly limited; however, the viscosity is preferably in a range of 10 to 10,000,000 mPa·s or in a range of 100 to 1,000,000 mPa·s.

The following compounds are examples of such organopolysiloxanes. Note that, in the formulae, Me, Vi, and Ph represent a methyl group, vinyl group, and a phenyl group, respectively; and n and n' are each independently an integer of 1 or greater.

ViMe$_2$SiO(Me$_2$SiO)$_n$SiMe$_2$Vi
ViPhMeSiO(Me$_2$SiO)$_n$SiMePhVi
ViPh$_2$SiO(Me$_2$SiO)$_n$SiPh$_2$Vi
ViMe$_2$SiO(Me$_2$SiO)$_n$(Ph$_2$SiO)$_{n'}$SiMe$_2$Vi
ViPhMeSiO(Me$_2$SiO)$_n$(Ph$_2$SiO)$_{n'}$SiPhMeVi
ViPh$_2$SiO(Me$_2$SiO)$_n$(Ph$_2$SiO)$_{n'}$SiPh$_2$Vi
ViMe$_2$SiO(MePhSiO)$_n$SiMe$_2$Vi
MePhViSiO(MePhSiO)$_n$SiMePhVi
Ph$_2$ViSiO(MePhSiO)$_n$SiPh$_2$Vi
ViMe$_2$SiO(Ph$_2$SiO)$_n$(PhMeSiO)$_{n'}$SiMe$_2$Vi
ViPhMeSiO(Ph$_2$SiO)$_n$(PhMeSiO)$_{n'}$SiPhMeVi
ViPh$_2$SiO(Ph$_2$SiO)$_n$(PhMeSiO)$_{n'}$SiPh$_2$Vi

The content of the organopolysiloxane is not particularly limited; however, the content is preferably in a range of 0 to 50 parts by mass or in a range of 0 to 30 parts by mass per 100 parts by mass of the total amount of components (A) to (C).

Furthermore, an inorganic filler such as silica, glass, alumina or zinc oxide; an organic resin fine powder of a polymethacrylate resin or the like; a heat-resistant agent, a dye, a pigment, a flame retardant, a solvent, and the like may be contained as optional components in the present composition at levels that do not impair the object of the present invention.

The viscosity at 25° C. of the present composition is not particularly limited; however, the viscosity is preferably in a range of 100 to 500,000 mPa·s or in a range of 100 to 100,000 mPa·s. The present composition is such that curing occurs either at room temperature or under heating, but it is preferable to heat the composition in order to achieve rapid curing. The heating temperature is preferably in a range of 50 to 200° C.

The cured product of the present invention will now be described in detail.

The cured product of the present invention is formed by curing the curable silicone composition described above. The shape of the cured product is not particularly limited, and examples include a sheet shape and a film shape. Furthermore, this cured product may be in the form of sealing or coating an optical semiconductor element or the like.

The optical semiconductor device of the present invention will now be explained in detail.

The optical semiconductor device of the present invention is characterized in that a light emitting element is sealed or coated with a cured product of the curable silicone composition described above. Examples of such an optical semiconductor device of the present invention include a light emitting diode (LED), a photocoupler, and a CCD. Examples of optical semiconductor elements include light emitting diode (LED) chips and solid-state image sensing devices.

FIG. 1 illustrates a cross-sectional view of a single surface mounted type LED, which is one example of the optical semiconductor device of the present invention. In the LED shown in FIG. 1, the optical semiconductor element 1 is die bonded to a lead frame 2, and this optical semiconductor element 1 is further wire bonded to a lead frame 3 by a bonding wire 4. A frame material 5 is provided around this optical semiconductor element 1, and the optical semiconductor element 1 inside the frame material 5 is sealed by a cured product 6 of the curable silicone composition of the present invention.

An example of the method for producing the surface mounted type LED illustrated in FIG. 1 is a method comprising die-bonding the optical semiconductor element 1 to the lead frame 2, wire-bonding this optical semiconductor element 1 and the lead frame 3 by means of a metal bonding wire 4, charging the curable silicone composition of the present invention inside the frame material 5 provided around the periphery of the optical semiconductor element 1, and then curing the curable silicone composition by heating at 50 to 200° C.

EXAMPLES

The curable silicone composition, the cured product thereof, and the optical semiconductor device of the present invention will be described in detail hereinafter using Examples. Note that values of viscosity in Examples are the values of viscosity at 25° C. In the formulae, Me, Ph, Vi, and Ep represent a methyl group, phenyl group, vinyl group, and 3-glycidoxypropyl group, respectively. Furthermore, the characteristics of the curable silicone composition and the cured product thereof were measured as follows, and the results are shown in Table 1.

[Refractive Index of Curable Silicone Composition]

The refractive index at 25° C. of the curable silicone composition was measured by an Abbe refractometer. A 589 nm light source was used for the measurement.

[Tensile Strength]

A sheet-like cured product having a thickness of 1 mm was prepared by curing the curable silicone composition at 150° C. for 1 hour using a press. Thereafter, this cured product was punched out in a No. 3 dumbbell-shape stipulated in JIS K 6251-1993, "Tensile testing methods for vulcanized rubber", and then the strength (MPa) at break was measured using the Autograph, manufactured by Shimadzu Corporation, and evaluated as follows.

◯: Strength at break was 3 MPa or greater

Δ: Strength at break was 1 MPa or greater but less than 3 MPa x: Strength at break was less than 1 MPa

[Dispersibility of Phosphor]

To 100 parts by mass of the curable silicone composition, 3 parts by mass of YAG phosphor (MX311(B), manufactured by Intematix Corporation) as component (G) was mixed using a dental mixer. Thereafter, the curable silicone composition containing the phosphor was coated on a glass plate and heated in an oven at 150° C. for 1 hour to be cured. The condition of dispersion of the phosphor in the obtained cured product was visually observed and result thereof was evaluated as follows.

○: Phosphor is uniformly dispersed

Δ: Phospher is partially aggregated x: Phospher is mostly aggregated

[Oxygen Permeability]

A sheet-like cured product having a thickness of 1 mm was prepared by curing the curable silicone composition at 150° C. for 1 hour using a press. The oxygen permeability of this cured product was measured at a temperature of 23° C. using the Oxygen permeation analyzer (model: 8001), manufactured by Systech Illinois.

○: Oxygen permeability was less than 10,000 cc/m²·24 h

Δ: Oxygen permeability was 10,000 cc/m²·24 h or greater but less than 15,000 cc/m²·24 h x: Oxygen permeability was 15,000 cc/m²·24 h or greater Synthesis Example 1

In a 4-necked flask equipped with a stirrer, a reflux condenser, and a thermometer, 62.8 g (0.34 mol) of 1,3-divinyl-1,1,3,3-tetramethyldisiloxane, 183.2 g (0.62 mol) of octamethylcyclotetrasiloxane, 267.2 g (1.35 mol) of phenyl-trimethoxysilane, and 0.29 g of trifluoromethanesulfonic acid were loaded and, while the mixture was being stirred, 72.8 g (4.04 mol) of water was added dropwise over 30 minutes. After completion of the addition, the mixture was heated to 85° C., and generated methanol was distilled off. Azeotropic dehydration was performed after adding 105 g of toluene and 2.8 g of 30% by mass potassium hydroxide aqueous solution. Thereafter, the mixture was maintained at 125° C. for 6 hours, then cooled to room temperature, and neutralized by 0.9 g of acetic acid. After the generated salt was filtered, low boiling point substances were removed from the obtained transparent solution by heating under reduced pressure to prepare 400 g (yield: 95%) of organo-polysiloxane that was colorless and transparent, that had a number average molecular weight of 2,300, and that was represented by the average unit formula:

$(ViMe_2SiO_{1/2})_{0.15}(Me_2SiO_{2/2})_{0.55}(PhSiO_{3/2})_{0.30}.$

Synthesis Example 2

In a 4-necked flask equipped with a stirrer, a reflux condenser, and a thermometer, 21.4 g (0.11 mol) of 1,3-divinyl-1,1,3,3-tetramethyldisiloxane, 221.0 g (0.74 mol) of octamethylcyclotetrasiloxane, 272.7 g (1.38 mol) of phenyl-trimethoxysilane, and 0.29 g of trifluoromethanesulfonic acid were loaded and, while the mixture was being stirred, 74.3 g (4.13 mol) of water was added dropwise over 30 minutes. After completion of the addition, the mixture was heated to 85° C., and generated methanol was distilled off. Azeotropic dehydration was performed after adding 105 g of toluene and 2.8 g of 30% by mass potassium hydroxide aqueous solution. Thereafter, the mixture was maintained at 125° C. for 6 hours, then cooled to room temperature, and neutralized by 0.9 g of acetic acid. After the generated salt was filtered, low boiling point substances were removed from the obtained transparent solution by heating under reduced pressure to prepare 400 g (yield: 95%) of organo-polysiloxane that was colorless and transparent, that had a number average molecular weight of 2,700, and that was represented by the average unit formula:

$(ViMe_2SiO_{1/2})_{0.05}(Me_2SiO_{2/2})_{0.65}(PhSiO_{3/2})_{0.30}.$

Synthesis Example 3

In a 4-necked flask equipped with a stirrer, a reflux condenser, and a thermometer, 32.6 g (0.17 mol) of 1,3-divinyl-1,1,3,3-tetramethyldisiloxane, 178.4 g (0.60 mol) of octamethylcyclotetrasiloxane, 320.8 g (1.62 mol) of phenyl-trimethoxysilane, and 0.31 g of trifluoromethanesulfonic acid were loaded and, while the mixture was being stirred, 87.4 g (4.85 mol) of water was added dropwise over 30 minutes. After completion of the addition, the mixture was heated to 85° C., and generated methanol was distilled off. Azeotropic dehydration was performed after adding 105 g of toluene and 2.8 g of 30% by mass potassium hydroxide aqueous solution. Thereafter, the mixture was maintained at 125° C. for 6 hours, then cooled to room temperature, and neutralized by 0.9 g of acetic acid. After the generated salt was filtered, low boiling point substances were removed from the obtained transparent solution by heating under reduced pressure to prepare 400 g (yield: 95%) of organo-polysiloxane that was colorless and transparent, that had a number average molecular weight of 3,100, and that was represented by the average unit formula:

$(ViMe_2SiO_{1/2})_{0.08}(Me_2SiO_{2/2})_{0.55}(PhSiO_{3/2})_{0.37}.$

Synthesis Example 4

In a 4-necked flask equipped with a stirrer, a reflux condenser, and a thermometer, 39.9 g (0.21 mol) of 1,3-divinyl-1,1,3,3-tetramethyldisiloxane, 158.8 g (0.54 mol) of octamethylcyclotetrasiloxane, 339.7 g (1.71 mol) of phenyl-trimethoxysilane, and 0.32 g of trifluoromethanesulfonic acid were loaded and, while the mixture was being stirred, 92.6 g (5.24 mol) of water was added dropwise over 30 minutes. After completion of the addition, the mixture was heated to 85° C., and generated methanol was distilled off. Azeotropic dehydration was performed after adding 105 g of toluene and 2.8 g of 30% by mass potassium hydroxide aqueous solution. Thereafter, the mixture was maintained at 125° C. for 6 hours, then cooled to room temperature, and neutralized by 0.9 g of acetic acid. After the generated salt was filtered, low boiling point substances were removed from the obtained transparent solution by heating under reduced pressure to prepare 400 g (yield: 95%) of organo-polysiloxane that was colorless and transparent, that had a number average molecular weight of 2,800, and that was represented by the average unit formula:

$(ViMe_2SiO_{1/2})_{0.10}(Me_2SiO_{2/2})_{0.50}(PhSiO_{3/2})_{0.40}.$

Synthesis Example 5

In a reaction vessel, 246.3 g of cyclic diphenylpolysiloxane, 598.4 g of cyclic dimethylpolysiloxane, 5.78 g of 1,3-divinyl-1,1,3,3-dimethyldisiloxane, and 0.26 g of potassium hydroxide were loaded and heated to 150° C. After the temperature reached 150° C., the reaction was performed for 7 hours. Thereafter, a predetermined amount of vinyldimethylchlorosilane was added to neutralize, and then low boiling point substances were removed under reduced pressure to prepare a dimethylsiloxane-diphenylsiloxane copolymer that was colorless and transparent, that had a refractive index of 1.46 and a viscosity of 5.8 Pas, and that was represented by the formula:

$ViMe_2SiO(Me_2SiO)_{260}(Ph_2SiO)_{40}SiMe_2Vi$.

Synthesis Example 6

In a 4-necked flask equipped with a stirrer, a reflux condenser, and a thermometer, 54.7 g (0.29 mol) of 1,3-divinyl-1,1,3,3-tetramethyldisiloxane, 87.1 g (0.29 mol) of octamethylcyclotetrasiloxane, 427.0 g (2.15 mol) of phenyltrimethoxysilane, and 0.34 g of trifluoromethanesulfonic acid were loaded and, while the mixture was being stirred, 110.8 g (6.15 mol) of water was added dropwise over 30 minutes. After completion of the addition, the mixture was heated to 85° C., and generated methanol was distilled off. Azeotropic dehydration was performed after adding 105 g of toluene and 2.8 g of 30% by mass potassium hydroxide aqueous solution. Thereafter, the mixture was maintained at 125° C. for 6 hours, then cooled to room temperature, and neutralized by 0.9 g of acetic acid. After the generated salt was filtered, low boiling point substances were removed from the obtained transparent solution by heating under reduced pressure to prepare 400 g (yield: 95%) of organopolysiloxane that was colorless and transparent, that had a number average molecular weight of 1,800, and that was represented by the average unit formula:

$(ViMe_2SiO_{1/2})_{0.15}(Me_2SiO_{2/2})_{0.30}(PhSiO_{3/2})_{0.55}$.

Synthesis Example 7

In a 4-necked flask equipped with a stirrer, a reflux condenser, and a thermometer, 82.2 g (0.44 mol) of 1,3-divinyl-1,1,3,3-tetramethyldisiloxane, 143 g of water, 0.38 g of trifluoromethanesulfonic acid, and 500 g of toluene were loaded and, while the mixture was being stirred, 524.7 g (2.65 mol) of phenyltrimethoxysilane was added dropwise over 1 hour. After completion of the addition, the mixture was heat-refluxed for 1 hour. The mixture was then cooled, and after the bottom layer was separated, the toluene solution layer was washed with water three times. To the water-washed toluene solution layer, 314 g (1.42 mol) of 3-glycidoxypropyl methyldimethoxysilane, 130 g of water, and 0.50 g of potassium hydroxide were added, and the mixture was heat-refluxed for 1 hour. Methanol was then distilled off, and the excess water was removed by azeotropic dehydration. After heat-refluxing for 4 hours, the toluene solution was cooled, neutralized with 0.55 g of acetic acid, and washed with water three times. After the water was removed, toluene was distilled off under reduced pressure to prepare an adhesion-imparting agent that had a viscosity of 8,500 mPa·s and that was represented by the average unit formula:

$(ViMe_2SiO_{1/2})_{0.18}(PhSiO_{3/2})_{0.53}(EpMeSiO_{2/2})_{0.29}$.

Practical Examples 1 to 7 and Comparative Examples 1 to 3

The following components were mixed in the compositions (part by mass) shown in Table 1 to prepare curable silicone compositions. Note that the "SiH/Vi" values in the Table 1 refer to the number of moles of silicon atom-bonded hydrogen atoms contained in components corresponding to component (C), relative to 1 mole of vinyl groups contained in components corresponding to components (A) and (B). Furthermore, the content of component (D) is expressed in terms of the content (ppm by mass) of platinum metal relative to the content of the curable silicone composition.

The following components were used as component (A).
Component (A-1): an organopolysiloxane prepared in Synthesis Example 1 and represented by the average unit formula:

$(ViMe_2SiO_{1/2})_{0.15}(Me_2SiO_{2/2})_{0.55}(PhSiO_{3/2})_{0.30}$.

(content of vinyl groups relative to content of all of the silicon atom-bonded organic groups: 8.1 mol %)
Component (A-2): an organopolysiloxane prepared in Synthesis Example 2 and represented by the average unit formula:

$(ViMe_2SiO_{1/2})_{0.05}(Me_2SiO_{2/2})_{0.65}(PhSiO_{3/2})_{0.30}$.

(content of vinyl groups relative to content of all of the silicon atom-bonded organic groups: 2.9 mol %)
Component (A-3): an organopolysiloxane prepared in Synthesis Example 3 and represented by the average unit formula:

$(ViMe_2SiO_{1/2})_{0.05}(Me_2SiO_{2/2})_{0.55}(PhSiO_{3/2})_{0.37}$.

(content of vinyl groups relative to content of all of the silicon atom-bonded organic groups: 4.7 mol %)
Component (A-4): an organopolysiloxane prepared in Synthesis Example 4 and represented by the average unit formula:

$(ViMe_2SiO_{1/2})_{0.10}(Me_2SiO_{2/2})_{0.50}(PhSiO_{3/2})_{0.40}$.

(content of vinyl groups relative to content of all of the silicon atom-bonded organic groups: 5.9 mol %)
Component (A-5): a phenylmethylpolysiloxane capped at both molecular terminals with dimethylvinylsiloxy groups that had a viscosity of 2,000 mPa·s
Component (A-6): an organopolysiloxane prepared in Synthesis Example 5 and represented by the average unit formula:

$ViMe_2SiO(Me_2SiO)_{260}(Ph_2SiO)_{40}SiMe_2Vi$.

The following components were used as component (B).
Component (B-1): an organopolysiloxane represented by the average unit formula:

$(ViMe_2SiO_{1/2})_{0.25}(PhSiO_{3/2})_{0.75}$ (content of vinyl groups relative to content of all of the silicon atom-bonded organic groups: 16.7 mol %)
Component (B-2): an organopolysiloxane prepared in Synthesis Example 6 and represented by the average unit formula:

$(ViMe_2SiO_{1/2})_{0.15}(Me_2SiO_{2/2})_{0.30}(PhSiO_{3/2})_{0.55}$ (content of vinyl groups relative to content of all of the silicon atom-bonded organic groups: 9.4 mol %)
Component (B-3): an organopolysiloxane represented by the average unit formula:

$(ViMe_2SiO_{1/2})_{0.10}(Me_3SiO_{1/2})_{0.40}(SiO_{4/2})_{0.50}$ (content of vinyl groups relative to content of all of the silicon atom-bonded organic groups: 6.7 mol %)
Component (B-4): an organopolysiloxane represented by the average unit formula:

$(ViMe_2SiO_{1/2})_{0.15}(Me_3SiO_{1/2})_{0.45}(SiO_{4/2})_{0.40}$ (content of vinyl groups relative to content of all of the silicon atom-bonded organic groups: 8.3 mol %)

The following components were used as component (C).

Component (C-1): an organotrisiloxane represented by the formula:

HMe$_2$SiOPh$_2$SiOSiMe$_2$H that had a viscosity of 4 mPa·s

Component (C-2): an organopolysiloxane represented by the average unit formula:

(HMe$_2$SiO$_{1/2}$)$_{0.40}$(SiO$_{4/2}$)$_{0.60}$ that had a viscosity of 20 mPa·s The following component was used as component (D).

Component (D-1): solution of a platinum-1,3-divinyl-1,1,3,3-tetramethyldisiloxane complex in 1,3,5,7-tetramethyl-1,3,5,7-tetravinylcyclotetrasiloxane (the solution contains 0.1% by mass of platinum)

The following component was used as component (E).

Component (E-1): 1-ethynylcyclohexanol

The following components were used as component (F).

Component (F-1): an adhesion-imparting agent prepared in Synthesis Example 7

Component (F-2): an adhesion-imparting agent that had a viscosity of 30 mPa·s and that was formed from a condensation reaction product of 3-glycidoxypropyltrimethoxysilane and a methylvinylsiloxane oligomer capped at both molecular terminals with silanol groups

TABLE 1

| Item | Present invention | | | | |
|---|---|---|---|---|---|
| | Practical Example 1 | Practical Example 2 | Practical Example 3 | Practical Example 4 | Practical Example 5 |
| Component (A-1) | 15 | — | — | — | 15 |
| Component (A-2) | — | 15 | — | — | — |
| Component (A-3) | — | — | 15 | — | — |
| Component (A-4) | — | — | — | 15 | — |
| Component (A-5) | — | — | — | — | — |
| Component (A-6) | — | — | — | — | — |
| Component (B-1) | 57.68 | 59.66 | 59.05 | 58.82 | — |
| Component (B-2) | — | — | — | — | 62.8 |
| Component (B-3) | — | — | — | — | — |
| Component (B-4) | — | — | — | — | — |
| Component (C-1) | 24.82 | 22.84 | 23.45 | 23.68 | 19.5 |
| Component (C-2) | — | — | — | — | — |
| Component (D-1) | 2.5 ppm | 2.5 ppm | 2.5 ppm | 2.5 ppm | 2.5 ppm |
| Component (E-1) | 0.03 | 0.03 | 0.03 | 0.03 | 0.03 |
| Component (F-1) | 2.3 | 2.3 | 2.3 | 2.3 | 2.5 |
| Component (F-2) | — | — | — | — | — |
| SiH/Vi | 1.0 | 1.0 | 1.0 | 1.0 | 1.0 |
| Viscosity (mPa · s) | 1300 | 2700 | 3900 | 3100 | 1400 |
| Refractive index | 1.523 | 1.524 | 1.525 | 1.526 | 1.509 |
| Tensile strength | ◯ | ◯ | ◯ | ◯ | Δ |
| Dispersibility of phosphor | ◯ | ◯ | ◯ | ◯ | ◯ |
| Crack resistance | ◯ | ◯ | ◯ | ◯ | ◯ |

| Item | Present invention | | Comparative Examples | | |
|---|---|---|---|---|---|
| | Practical Example 6 | Practical Example 7 | Comparative Example 1 | Comparative Example 2 | Comparative Example 3 |
| Component (A-1) | 44.32 | — | — | — | — |
| Component (A-2) | — | 49.12 | — | — | — |
| Component (A-3) | — | — | — | — | — |
| Component (A-4) | — | — | — | — | — |
| Component (A-5) | — | — | 15 | 15 | — |
| Component (A-6) | — | — | — | — | 51.83 |
| Component (B-1) | — | — | 59.43 | — | — |
| Component (B-2) | — | — | — | 64.6 | — |
| Component (B-3) | 8.64 | 8.64 | — | — | 8.64 |
| Component (B-4) | 30.24 | 30.24 | — | — | 30.24 |
| Component (C-1) | — | — | 23.07 | 17.7 | — |
| Component (C-2) | 11 | 15.8 | — | — | 8.29 |
| Component (D-1) | 5 ppm | 5 ppm | 2.5 ppm | 2.5 ppm | 5 ppm |
| Component (E-1) | 0.03 | 0.03 | 0.03 | 0.03 | 0.03 |
| Component (F-1) | — | — | 2.3 | 2.5 | — |
| Component (F-2) | 0.5 | 0.5 | — | — | 0.5 |
| SiH/Vi | 1.2 | 1.2 | 1.0 | 1.0 | 1.2 |
| Viscosity (mPa · s) | 400 | 1200 | 1900 | 2100 | 2000 |
| Refractive index | 1.439 | 1.442 | 1.535 | 1.520 | 1.436 |
| Tensile strength | Δ | Δ | Δ | X | X |
| Dispersibility of phosphor | ◯ | ◯ | X | Δ | ◯ |
| Crack resistance | ◯ | Δ | ◯ | ◯ | X |

As is clear from the results in Table 1, it was found that the curable silicone compositions prepared in Practical Examples 1 to 7 exhibited superior dispersibility of phosphor and superior balance of strength and gas barrier properties compared to those of the curable silicone compositions prepared in Comparative Examples 1 to 3.

INDUSTRIAL APPLICABILITY

The curable silicone composition of the present invention exhibits excellent dispersibility of phosphor and forms a cured product having high strength and gas barrier properties when the curable silicone composition is cured. Therefore, the curable silicone composition of the present invention is suitable as sealing agents, protective coating agents, and the like of optical semiconductor elements in optical semiconductor devices, such as light emitting diodes (LEDs) and the like.

REFERENCE NUMERALS

1 Optical semiconductor element
2 Lead frame
3 Lead frame
4 Bonding wire
5 Frame material
6 Cured product of curable silicone composition

The invention claimed is:
1. A curable silicone composition comprising:
(A) an organopolysiloxane represented by the average unit formula:

$(R^1_3SiO_{1/2})_a(R^2_2SiO_{2/2})_b(R^3SiO_{3/2})_c$ in the formula, $R^1$ are the same or different, and are alkyl groups having from 1 to 12 carbon atoms, alkenyl groups having from 2 to 12 carbon atoms, aryl groups having from 6 to 20 carbon atoms, or aralkyl groups having from 7 to 20 carbon atoms; $R^2$ are the same or different, and are alkyl groups having from 1 to 12 carbon atoms or alkenyl groups having from 2 to 12 carbon atoms $R^3$ is an alkyl group having from 1 to 12 carbon atoms, aryl group having from 6 to 20 carbon atoms, or an aralkyl group having from 7 to 20 carbon atoms, provided that, in a molecule, at least 0.5 mol % of a total content of the groups represented by $R^1$, $R^2$, and $R^3$ are the alkenyl groups, at least one of the group represented by $R^3$ is the aryl group or the aralkyl group; and a, b, and c are numbers satisfying: $0.01 \le a \le 0.5$, $0.4 \le b \le 0.8$, $0.01 \le c \le 0.5$, and $a+b+c=1$;
(B) from 20 to 1,000 parts by mass, relative to 100 parts by mass of component (A), of an organopolysiloxane represented by the average unit formula:

$(R^4_3SiO_{1/2})_d(R^4_2SiO_{2/2})_e(R^4SiO_{3/2})_f(SiO_{4/2})_g$ in the formula, $R^4$ are the same or different, and are alkyl groups having from 1 to 12 carbon atoms, alkenyl groups having from 2 to 12 carbon atoms, aryl groups having from 6 to 20 carbon atoms, or aralkyl groups having from 7 to 20 carbon atoms, provided that, in a molecule, at least 0.5 mol % of the total content of the groups represented by $R^4$ are the alkenyl groups; and d, e, f, and g are numbers satisfying: $0.01 \le d \le 0.5$, $0 \le e \le 0.9$, $0 \le f \le 0.9$, $0 \le g \le 0.9$, and $d+e+f+g=1$; however, if f is a number satisfying: $0 \le f \le 0.5$, g is a number satisfying: $0 < g \le 0.9$;
(C) an organopolysiloxane having at least two silicon atom-bonded hydrogen atoms in a molecule, in an amount such that a content of the silicon atom-bonded hydrogen atoms contained in this component is from 0.1 to 10 mol relative to 1 mol of the total content of the alkenyl groups contained in components (A) and (B); and
(D) a hydrosilylation reaction catalyst, in an amount that accelerates curing of the composition.

2. The curable silicone composition according to claim 1, wherein component (A) is an organopolysiloxane in which $R^2$ of the average unit formula are the same or different alkyl groups having from 1 to 12 carbon atoms.

3. The curable silicone composition according to 2, further comprising (G) a phosphor, in an amount of from 0.1 to 70% by mass relative to the total amount of components (A) to (C).

4. The curable silicone composition according to claim 1, further comprising (E) a hydrosilylation reaction inhibitor, in an amount of from 0.01 to 3 parts by mass per 100 parts by mass of the total amount of components (A) to (C).

5. The curable silicone composition according to claim 1, further comprising (F) an adhesion-imparting agent, in an amount of from 0.1 to 5 parts by mass per 100 parts by mass of the total amount of components (A) to (C).

6. The curable silicone composition according to claim 1, further comprising (G) a phosphor, in an amount of from 0.1 to 70% by mass relative to the total amount of components (A) to (C).

7. A cured product produced by curing the curable silicone composition according to claim 6.

8. An optical semiconductor device comprising an optical semiconductor element sealed or coated with a cured product of the curable silicone composition according to claim 6.

9. A cured product produced by curing the curable silicone composition according to claim 1.

10. An optical semiconductor device comprising an optical semiconductor element sealed or coated with a cured product of the curable silicone composition according to claim 1.

* * * * *